United States Patent [19]

Kiryu et al.

[11] Patent Number: 4,925,713
[45] Date of Patent: May 15, 1990

[54] LIGHTSAFE MASKING FILM

[75] Inventors: Naohiko Kiryu, Urawa; Kazutoshi Kimizuka, Kitakatsushika; Etsuko Minezaki; Hiroshi Maruyama, both of Misato, all of Japan

[73] Assignee: Somar Corporation, Japan

[21] Appl. No.: 284,634

[22] Filed: Dec. 15, 1988

[30] Foreign Application Priority Data

Sep. 27, 1988 [JP] Japan ................................ 63-243070

[51] Int. Cl.$^5$ .............................................. B30B 7/06
[52] U.S. Cl. ...................................... 428/40; 428/412; 428/333; 428/483; 428/476.3; 428/500
[58] Field of Search ................. 428/40, 412, 333, 483, 428/476.3, 500

[56] References Cited

U.S. PATENT DOCUMENTS 3,619,335  11/1971  Bryan ...................................... 161/1
3,892,900   7/1975  Shima et al. ......................... 428/40
4,681,784   7/1987  Ebara et al. ......................... 428/40

FOREIGN PATENT DOCUMENTS 0188292   7/1986  European Pat. Off. .
802811   12/1954  United Kingdom .

Primary Examiner—Edith Buffalow
Attorney, Agent, or Firm—Lorusso & Loud

[57] ABSTRACT

A lightsafe masking film for use in masking a roomlight film is disclosed which comprises a substrate, and a transparent, lightsafe layer peelably provided over the surface of the substrate and containing a combination of specific yellow and blue colorants so that the lightsafe layer is green or light green in color but can effectively block light to which the roomlight film is sensitive.

12 Claims, 1 Drawing Sheet

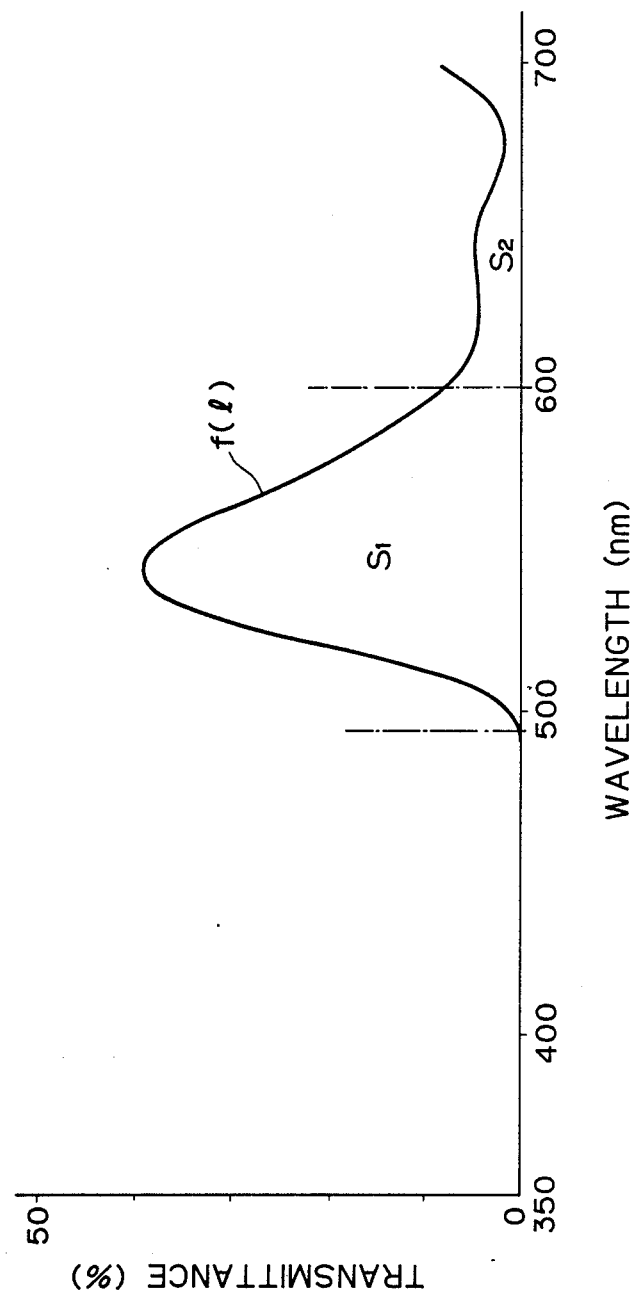

LIGHTSAFE MASKING FILM

This invention relates generally to a lightsafe masking film and, more specifically, to a composite, lightsafe masking film to be used as an original copy having a transparent pattern in the phtomechanical reproduction process.

One known lighsafe masking film of this type is composed of a plastic film substrate and a peelable, lightsafe layer provided thereon. When a desired cutting line is formed on the lightsafe layer manually or with a suitable automatic cutting device and when the cut portion is removed by peeling, there leaves a desired transparent pattern on the masking film.

The lightsafe layer is generally comprised of a colorant functioning as a lightsafe substance. The colorant conventionally used is predominantly a red colorant because of its good light-blocking characteristics. Lightsafe masking films with a reddish color, however, suffer from a drawback that cutting works and succeeding peeling works become inefficient since the red color of the film causes eyes of the workers to be strained and taxed. Whilst the use of a masking film employing a green colorant could improve the workability, such a film in turn causes a problem of poor light-blocking property.

The present invention is contemplated to solve the problem of the conventional lightsafe masking film. In accordance with one aspect of the present invention, there is provided a lightsafe masking film comprising a transparent substrate, and a transparent, lightsafe layer peelably provided over the surface of said substrate and containing a yellow colorant capable of blocking light having a wavelength of 480 nm or less and a blue colorant so that (a) the color of the lightsafe layer is greenish, (b) the spectral transmittance of the lightsafe layer has a peak at a wavelength of 540–570 nm, (c) the lightsafe layer can block light having a wavelength of 480 nm or less, and (d) the lightsafe layer has such a light transmission characteristic that the ratio of an integrated spectral transmittance in the wavelength range of 480–600 nm to that in the wavelength range of 480–700 nm is 0.6 or more.

In another aspect, the present invention provides a lightsafe masking film comprising a transparent substrate, and a transparent, lightsafe layer peelably provided over the surface of said substrate and containing a light yellow colorant and a blue colorant so that the color of the lightsafe layer is light green and the lightsafe layer can block light having a wavelength of 450 nm or less, said lightsafe layer further containing a UV ray absorbing substance.

The present invention will now be described in detail below with reference to the accompanying drawing, in which the sole FIGURE is a spectral transmittance chart showing a relationship between wavelength and spectral transmittance of a masking film of the present invention.

Lightsafe masking film according to the present invention is comprised of a transparent substrate formed of a plastic material having provided thereon a peelable, transparent, lightsafe layer.

Any plastic material conventionally used as a substrate in known lightsafe masking films can be used for the purpose of the present invention. Transparent plastic films such as polyethylene terephthalate films, polybutylene terephthalate films, polyoxybenzoate films and polycarbonate films may be suitably used as the substrate. Both stretched and unstretched films may be used. The thickness of the film is generally in the range of 20–300 $\mu$m.

The substrate is overlaid with a peelable, lightsafe layer generally composed of (i) a binder such as a synthetic rubber, e.g. a nitrile rubber, or a synthetic resin, e.g. a vinyl chloride/vinylidene chloride copolyme or a vinyl chloride/vinyl acetate copolym, and (ii) a lightsafe or light-shading substance. Any binder customarily used in lightsafe layer of known masking films may be used for the purpose of the present invention. The lightsafe layer may further contain one or more additives used in conventional masking films, if desired. The lightsafe layer generally has a thickness of 20–50 $\mu$m, preferably 23–43 $\mu$m.

In one embodiment according to the present invention, the lightsafe layer contains, as the lightsafe substance, a mixture of a yellow colorant capable of blocking light having a wavelength of 480 nm or less and a blue colorant. The combination of the two colorant is so selected that (a) the color of the lightsafe layer is greenish, (b) the spectral transmittance of the lightsafe layer has a peak at a wavelength of 540–570 nm (the spectral transmittance is maximum at the peak in visible light wavelength region), (c) the lightsafe layer can block light having a wavelength of 480 nm or less, and (d) the lightsafe layer has such a light transmission characteristic that the ratio ($Y_1/Y_2$) of an integrated spectral transmittance in the wavelength range of 480–600 nm ($Y_1$) to that in the wavelength range of 480–700 nm ($Y_2$) is 0.6 or more, preferably 0.8 or more.

When the spectral transmittance peak of the lightsafe layer is present outside the 540–570 nm wavelength range, it becomes impossible to obtain a lightsafe masking film having a green lightsafe layer and capable of effectively blocking light having a wavelength of 480 nm or less. When the ratio $Y_1/Y_2$ is less than 0.6, the lightsafe layer becomes yellowish and fails to show a desired green color.

For the purpose of the present specification, the term "integrated spectral transmittance" is intended to refer to an integration of spectral transmittance with respect to wavelength between a given wavelength range and is defined as follows.

$$Y = \int_{l_1}^{l_2} f(l) dl$$

where Y is an integrated spectral transmittance in the wavelength region of between $l_1$ and $l_2$, and f(l) is a spectral transmittance which is a function of wavelength l. ("Spectral transmittance" may also be termed "light transmissivity".) Thus, the ratio $Y_1/Y_2$ (the ratio of an integrated spectral transmittance in the wavelength range of 480–600 nm to that in the wavelength range of 480–700 nm) can be expressed as follows:

$$Y_1/Y_2 = \frac{\int_{480}^{600} f(l) dl}{\int_{480}^{700} f(l) dl}$$

Referring to the accompanying drawing which shows an example of a spectral transmittance of a lightsafe layer of the present invention, the integrated spectral transmittance in the wavelength range of 480–600 nm ($Y_1$) is an area $S_1$ of the domain defined between the spectral transmittance curve f(l) and the abscissa of 480–600 nm. The integrated spectral transmittance in the wavelength range of 480–700 nm ($Y_2$) is an area $S_2$ of the domain defined between the spectral transmittance curve f(l) and the abscissa of 480–700 nm.

The yellow colorant to be used in the present invention should be capable of blocking light having a wavelength of 480 nm or less. Illustrative of suitable yellow colorants are Savinyl Yellow RLS (C.I. Solvent Yellow 83), Aizen SOT Yellow-1 (C.I. Solvent Yellow 56), Mihara Oil Yellow 3G and Neo Zapon Yellow 081 (C.I. Solvent Yellow 79). Other yellow colorants may be of course usable for the purpose of the present invention. These yellow colorants may be used singly or in combination of two or more.

Any blue colorant may be used for the purpose of the present invention as long as it can give a lightsafe layer having the above-mentioned characteristics (a) through (d) when used in combination with the yellow colorant. Examples of such blue colorant include Vali Fast Blue 1605 (Corlor Index (C.I.) Solvent Blue 38), Vali Fast Blue 2606 (C.I. Solvent Blue 20), Savinyl Blue GLS (C.I. Solvent Blue 44), Nozapon Blue 807 (C.I. Solvent Blue 70), Neo Super Blue C-531 (C.I. Solvent Blue 70), Neo Super Blue C-551 (C.I. Solvent Blue 70) and Oil Blue BO (C.I. Solvent Blue 25). These blue colorants may be used singly or in combination of two or more.

The yellow and blue colorants are used in an amount so that the lightsafe layer is imparted with desired light-blocking properties but is kept transparent. The total amount of the yellow and blue colorants in the lightsafe layer is generally 2–50% by weight, preferably 5–30% by weight.

In another embodiment according to the present invention, the lightsafe substance to be incorporated into the lightsafe layer contains a light yellow colorant and a blue colorant so that the color of the lightsafe layer is light green and the lightsafe layer can block light having a wavelength of 450 nm or less, and the lightsafe layer further contains a UV ray absorbing substance.

In the first embodiment, the lightsafe layer has a green or dark green color. Therefore, when an original is overlaid with the masking film for forming cut lines, the pattern of the original becomes vague and is difficult to trace. With a masking film of the second embodiment, on the other hand, since the lightsafe layer is light green, patterns of the original are seen clearly through the masking film placed on the original, thereby to permit easy formation of cut lines by tracing. The lightsafe layer preferably has an spectral transmittance peak at a wavelength between 530 and 570 nm. It is also preferred that the transmittance exceeds 50% at that peak.

The light yellow colorant to be used in conjunction with the blue colorant in the second embodiment is preferably a lemon color colorant that can block light having a wavelength of 450 nm or less. Examples of the light yellow colorant include Orsaol Yellow 2GLN (C.I. Solvent Yellow 88), Savinyl Yellow 2GLS (C.I. Solvent Yellow 79), Vali Fast Yellow 4120 (C.I. Solvent Yellow 82), Vali Fast Yellow 2110 (C.I. Solvent Yellow 79), Vali Fast Yellow 1101, Vali Fast Yellow 1105, Mihara Oil Yellow 5G, Mihara Oil Yellow 10G, Kayaset Yellow K-RL, Oil Yellow 101 (C.I. Solvent Yellow 34), Oil Yellow 107 (C.I. Solvent Yellow 42), Oil Yellow D (C.I. Solvent Yellow 93), Neo Super Yellow C-131 (C.I. Solvent Yellow 21), and Neo Super Yellow C-132 (C.I. Solvent Yellow 151). These light yellow colorants may be used either by themselves or in combination of two or more.

Any blue colorant may be used for the purpose of the second embodiment according to the present invention as long as it can give a lightsafe layer having the above-mentioned characteristics when used in combination with the light yellow colorant. The above-exemplified blue colorants to be used in the first embodiment may be also used for the second embodiment.

The light yellow and blue colorants are used in an amount so that the lightsafe layer is imparted with desired light-blocking properties but is kept transparent. The total amount of the light yellow and blue colorants in the lightsafe layer is generally 2–50% by weight, preferably 5–30% by weight.

Any known UV ray absorbing agent may be incorporated into the lightsafe layer of the masking film of the second embodiment. Salicilic acid esters, benzotriazols and benzophenones are examples of such UV ray absorbing agent. Of these, benzophenones (benzophenone or substituted benzophenones) are particularly preferred for reasons of freeness of bleeding from the lightsafe layer. The UV ray absorbing agent is generally used in an amount of 0.2–1.0 part by weight, preferably 0.5–0.7 part by weight per part by weight of the mixed colorants. The use of the UV ray absorbing agent in conjunction with the mixed colorants can provide a lightsafe layer with suitable light-blocking properties.

In the above first and second embodiments, it is possible to provide a pressure sensitive adhesive layer between the substrate and the lightsafe layer so that the resulting masking film may permit the reuse of a cut lightsafe layer peeled off from the substrate for resticking. Such a adhesive layer is formed of a synthetic resin adhesive such as an acrylate ester copolymer, a saturated polyester or a polyurethane, or a rubber adhesive such as a natural rubber, a chloroprene rubber or a nitrile rubber.

When such a pressure sensitive adhesive layer is provided between the substrate and the lightsafe layer, it is preferred that the lightsafe layer be comprised of (A) nitrile rubber, (B) nitrocellulose, (C) plasticizer and (D) the mixed lightsafe colorants as mentioned above, for reasons of improved surface nontackiness.

The nitrile rubber (A) is, for example, a copolymer of acrylonitrile and other copolymerizable monomer, such as a copolymer of acrylonitrile and butadienen or a terpolymer of acrylonitrile, butadiene and a carboxyl group-containing monomer, and preferably has an acrylonitrile content of 19–51% by weight. The nitrile rubber imparts suitable adhesiveness and suitable peelability to the lightsafe layer.

The nitrocellulose (B) serves to function as a tackiness reducing agent in cooperation with the nitrile rubber. The nitrocellulose having a nitrogen content of 10.7–12.2% by weight is preferably used.

The plasticizer (C) serves to improve the flexibility of the lightsafe layer so that the layer can be peeled off without breackage or damage and can be reused for resticking. Examples of such plasticizers include fatty acid esters, preferably those having a molecular weight of 300–500, trimellitic acid esters, preferably those having a molecular weight of 500–700, epoxidized fatts and fatty oils (glycerides), preferably those having a molecular weight of about 300–1300, and epoxidized fatty acid esters (non-glycerides), preferably those having a molecular weight of about 300–1300. Illustrative of suitable plasticizers are di(butoxyethoxyethyl) adipate, trioctyl trimellitate, epoxidized soybean oil, epoxidized linseed oil, methyl epoxystearate, butyl epoxystearate, octyl epoxystearate and di(2-ethylhexyl) epoxyhexahydrophthalate.

The above four ingredients are used in the following proportions. The weight ratio of (A) to (B) is generally from 20:80 to 80:20, preferably from 30:70 to 70:30. The amount of (C) is generally from 0.1 to 30 parts by eight, preferably from 0.5 to 20 parts by weight per 100 parts by weight of total resin solids in (A) and (B). The amount of the mixed lightsafe colorants (D) is generally from 3 to 30 parts by weight, preferably from 5 to 20 parts by weight per 100 parts by weight of total resin solids in (A) and (B).

In addition to the four ingredients (A)–(D), the lightsafe layer to be provided over the surface of the adhesive layer can contain an organic compound such as benzoguanamine resin or an inorganic compound such as silica, both of which are incomptible with the four ingredients (A)–(D). The addition of such compounds prevents the reflection of light from the surface of the lightsafe layer and reduces the surface tackiness thereof. Such an additive is generally used from 0.1 to 20 parts by weight per 100 parts by weight of total resin solids in (A) and (B).

The lightsafe masking film may be fabricated in any known manner, for example, by applying coatings of respective coating compositions successively on a substrate. Organic solvent or solvents are used for the formation of coating compositions which may be in the form of a dispersion or solution. If desired, a portion of the colorants to be incorporated into the lightsafe layer may be incorporated into an overcoat layer provided over the lightsafe layer, an undercoat layer (such as the above described pressure sensitive adhesive layer) provided beneath the lightsafe layer.

The lightsafe masking film according to the present invention is used for the masking of a roomlight photosensitive material, such as of a silver salt-type or a photoresin-type, which is sensitive to light with wavelengths of 400 nm or less.

The following examples will further illustrate the present invention.

EXAMPLE 1

A coating liquid having the composition shown in Table 1 below was prepared.

TABLE 1

| Ingredient | Amount (parts by weight) |
| --- | --- |
| Colorant YL-1*[1] | 2 |
| Colorant BL-1*[2] | 0.5 |
| Acrylonitrile/butadiene rubber | 4 |
| Vinyl chloride/vinylidene chloride copolymer | 20 |
| Toluene | 30 |
| Methyl ethyl keton | 35 |

*[1]Yellow colorant (Savinyl Yellow RLS, C.I. Solvent Yellow 83) capable of blocking light with a wavelength of 495 nm or less.
*[2]Blue colorant (Vali Fast Blue 2606, C.I. Solvent Blue 20) having two absorption peaks at wavelengths of 625 and 677 nm.

The coating liquid was applied to the surface of a polyethylene terephthalate film (thickness: 100 μm) and the coated layer was dried to obtain a masking film having a peelable, lightsafe layer having a thickness of 25 μm. The masking film was measured for its spectral transmittance. The resulting spectrum chart (wavelength-transmittance curve) was as shown in the accompany8ing drawing. As seen from the Figure, the masking film can block light having a wavelength of 480 nm or less. The spectral transmittance has a peak at a wavelength of about 545 nm. From the areas of the domains $S_1$ and $S_2$ defined, respectively, between the spectral transmittance curve and the abscissa of 480–600 nm and between the spectral transmittance curve and the abscissa of 480–700 nm, the ratio of the integrated spectral transmittance in the wavelength range of 480–600 nm ($Y_1$) to the integrated spectral transmittance in the wavelength range of 480–700 nm ($Y_2$) is calculated as being about 0.90. The masking film was superimposed on an original and cut lines were manually formed by tracing with a knife. The cutting works was able to be carried out efficiently without encountering eye strain problems. The film was found to be effectively used for masking a roomlight photosensitive material.

COMPARATIVE EXAMPLE 1

Example 1 was repeated in the same manner as described except that the amount of the blue colorant BL used was decreased to 0.1 part. The resulting masking film was found to have a spectral transmittance peak at 600 nm, an $Y_1/Y_2$ ratio of 0.58 and a yellowish green color and to block light with a wavelength of 500 nm or less. Because of its yellowish green color, the film caused eye strains during cut line forming works.

EXAMPLE 2

A coating liquid having the composition shown in Table 2 below was prepared.

TABLE 2

| Ingredient | Amount (parts by weight) |
| --- | --- |
| Colorant YL-2*[3] | 4.0 |
| Colorant YL-3*[4] | 2.41 |
| Colorant BL-2*[5] | 0.275 |
| UV ray absorbing agent*[6] | 1.5 |
| Acrylonitrile/butadiene rubber*[7] | 30 |
| Vinyl chloride/vinylidene chloride copolymer*[8] | 70 |
| Tackiness reducing agent*[9] | 1.5 |
| Methyl ethyl keton | 439 |

*[3]Yellow colorant (Oil Yellow 101, C.I. Solvent Yellow 34, Orient Chemical Industry Co., Ltd.)
*[4]Yellow colorant (Vali Fast Yellow 4120, C.I. Solvent Yellow 82, Orient Chemical Industry Co., Ltd.)
*[5]Blue colorant (Neozapon Blue 807, C.I. Solvent Blue 70)
*[6]2,2',4,4'-tetrahydroxybenzophenone
*[7]Nypol 1042, Nihon Zeon Inc., Acrylonitrile conent: 33 wt %
*[8]VYHH, Union Carbide Inc., vinyl chloride content: 86%
*[9]Silica (Syloid 74, Fuji-Devitson Inc.)

The coating liquid was applied to the surface of a polyethylene terephthalate film (thickness: 100 μm) and the coated layer was dried to obtain a masking film having a light green, peelable, lightsafe layer having a thickness of 25 μm. The masking film was able to block light having a wavelength of 450 nm or less and a spectral transmittance peak at 545 nm. The transmittance at that peak was over 50%. The masking film was superimposed on an original and cut lines were manually formed by tracing with a knife. The pattern of the original was clearly seen through the film. The cutting works was able to be carried out efficiently without encountering eye strain problems. The film was found to be effectively used for masking a roomlight photosensitive material.

COMPARATIVE EXAMPLE 2

Example 2 was repeated in the same manner as described except that no UV ray absorbing agent was used. The resulting masking film failed to block light having a wavelength of 310–350 nm.

EXAMPLE 3

A coating liquid having the composition shown in Table 3 below was prepared.

TABLE 3

| Ingredient | Amount (parts by weight) |
| --- | --- |
| Colorant YL-1 | 1.3 |
| Colorant BL-1 | 0.3 |
| Nitrocellulose (H ½) | 40 |
| Acrylonitrile/butadiene rubber*[7] | 35 |
| Plasticizer*[10] | 8 |
| Tackiness reducing agent*[9] | 2 |
| Methyl ethyl keton | 290 |

*[10]Epoxidized fatty acid ester (Sansosizer E-4030, Shin Nihon Rika Inc.)

A polyethylene terephthalate film (thickness: 100 μm) was coated with a chloroprene-containing pressure sensitive adhesive layer (thickness after drying: 3 μm). Then the above coating liquid was applied to the surface of the adhesive layer and the coated layer was dried to obtain a masking film having a peelable, lightsafe layer (thickness: 40 μm) provided on the adhesive layer. The masking film exhibited light-blocking and spectral transmittance characteristics similar to that of Example 1. The surface of the film was not sticky. The lightsafe layer exhibited good peelability. The lightsafe layer once peeled off permitted repeated use for resticking.

What is claimed is:

1. A lightsafe masking film comprising a transparent substrate, and a transparent, lightsafe layer peelably provided over the surface of said substrate and containing a yellow colorant capable of blocking light having a wavelength of 480 nm or less and a blue colorant so that (a) the color of the lightsafe layer is greenish, (b) the light transmissivity of the lightsafe layer is maximum at a wavelength of 540–570 nm, (c) the lightsafe layer can block light having a wavelength of 480 nm or less, and (d) the lightsafe layer has such a light transmission characteristic that the ratio of the integral light transmissivity in the wavelength range of 480–600 nm to that in the wavelength range of 480–700 nm is 0.6 or more.

2. A lightsafe masking film as claimed in claim 1, wherein the ratio of the integral light transmissivity in the wavelength range of 480–600 nm to that in the wavelength range of 480–700 nm is 0.8 or more.

3. A lightsafe masking film as claimed in claim 1, further comprising a pressure sensitive adhesive layer provided between said substrate and said lightsafe layer.

4. A lightsafe masking film as claimed in claim 3, wherein said pressure sensitive adhesive layer comprises a synthetic resin adhesive or a rubber adhesive.

5. A lightsafe masking film as claimed in claim 4, wherein said lightsafe layer further contains a nitrile rubber, a nitrocellulose and a plasticizer.

6. A lightsafe masking film comprising a transparent substrate, and a transparent, lightsafe layer peelably provided over the surface of said substrate and containing a light yellow colorant and a blue colorant so that the color of the lightsafe layer is light green and the lightsafe layer can block light having a wavelength of 450 nm or less, said lightsafe layer further containing a UV ray absorbing substance.

7. A lightsafe masking film as claimed in claim 6, wherein said UV ray absorbing substance is of benzophenone or a substituted benzophenone.

8. A lightsafe masking film as claimed in claim 6, wherein the spectral transmittance of said lightsafe layer has a peak between a wavelength of 530–570 nm.

9. A lightsafe masking film as claimed in claim 8, wherein the spectral transmittance of said lightsafe layer is 50% or more at said peak.

10. A lightsafe masking film as claimed in claim 6, further comprising a pressure sensitive adhesive layer provided between said substrate and said lightsafe layer.

11. A light safe masking film as claimed in claim 10, wherein said pressure sensitive adhesive layer comprises a synthetic resin adhesive or a rubber adhesive.

12. A light safe masking film as claimed in claim 11, wherein said light safe layer further contains a nitrile rubber, a nitrocellulose and a plasticizer.

* * * * *

UNITED STATES PATENT AND TRADEMARK OFFICE
CERTIFICATE OF CORRECTION

PATENT NO. : 4,925,713

DATED : May 15, 1990

INVENTOR(S) : KIRYU et al

It is certified that error appears in the above-identified patent and that said Letters Patent is hereby corrected as shown below:

Column 2, line 8, "Copolyme" should read --copolymer--.

line 9, "copolym" should read --compolymer--.

Column 5, line 10, "eight" should read --weight--.

Column 6, line 1, "pany8ing" should read --panying--.

UNITED STATES PATENT AND TRADEMARK OFFICE
CERTIFICATE OF CORRECTION

PATENT NO. : 4,925,713

DATED : May 15, 1990

INVENTOR(S) : KIRYU et al

It is certified that error appears in the above-identified patent and that said Letters Patent is hereby corrected as shown below:

Col. 6, lines 42 and 43, "Vinyl chloride/vinylidene chloride copolymer" should read --vinyl chloride/vinyl acetate copolymer--.

Signed and Sealed this

Sixteenth Day of February, 1993

Attest:

STEPHEN G. KUNIN

*Attesting Officer*    Acting Commissioner of Patents and Trademarks